US005696928A

United States Patent [19]
Grewe et al.

[11] Patent Number: 5,696,928
[45] Date of Patent: Dec. 9, 1997

[54] MEMORY CHIP ARCHITECTURE FOR DIGITAL STORAGE OF PRERECORDED AUDIO DATA WHEREIN EACH OF THE MEMORY CELLS ARE INDIVIDUALLY ADDRESSABLE

[75] Inventors: Anthony James Grewe, Holmdel; Kevin Alan Shelby, Red Bank, both of N.J.

[73] Assignee: Lucent Technologies, Murray Hill, N.J.

[21] Appl. No.: 447,335

[22] Filed: May 22, 1995

[51] Int. Cl.⁶ .................................................. G06F 13/00
[52] U.S. Cl. ..................... 395/430; 395/436; 395/442; 379/67; 379/68; 379/88; 364/DIG. 1
[58] Field of Search .............................. 395/430, 436, 395/442; 379/67, 68, 88

[56] References Cited

U.S. PATENT DOCUMENTS

| | | | |
|---|---|---|---|
| 4,798,322 | 1/1989 | Bernstein et al. | |
| 4,813,014 | 3/1989 | DeBell | 365/45 |
| 5,068,783 | 11/1991 | Tanagawa et al. | 395/575 |
| 5,119,172 | 6/1992 | Cho et al. | |
| 5,199,033 | 3/1993 | McGeoch et al. | 371/10.1 |
| 5,444,767 | 8/1995 | Goetcheus et al. | 379/67 |
| 5,535,356 | 7/1996 | Kim et al. | 395/430 |

OTHER PUBLICATIONS

"Happy Birthday! (This Is A Recording)", Electronic Buyers News, Nov. 8, 1993, p. 6.
"Portable Stereo From Memory Chip Card", Screen Digest, Jan. 1995.
"Santa Barbara Growth Stock Conference: Norris Communications Corp. Body", Financial News. p. 3, Oct. 1994.
"Technology & Health: Norris Plans To Launch Digital Recorder Using Flash Memory Chips From Intel", The Wall Street Journal, Sec B p. 3, Don Clark, Staff Reporter, Mar. 1994.

*Primary Examiner*—Frank J. Asta

[57] ABSTRACT

A memory device for digital storage of pre-recorded audio. Contained within a housing adapted for insertion into a solid state audio player is an array of memory cells for storage of digitally recorded audio. Each of the memory cells is individually addressable over a parallel address bus and data is read and/or written over a parallel data bus. Data is transmitted to and from the device by means of a serial interface with the solid state audio player. Shift registers within the memory device are coupled to the serial interface for transmitting serial data to and receiving serial data from the audio player. Data buffers are interposed between the address bus, data bus and respective shift registers for storing data to be placed on the address bus and receiving data from the data bus. In accordance with one aspect of the invention, a series of capacitive plates is included to provide a contact-less interface between the memory device and the associated solid state audio player.

19 Claims, 4 Drawing Sheets

MEMORY CHIP ARCHITECTURE FOR DIGITAL STORAGE OF PRERECORDED AUDIO DATA WHEREIN EACH OF THE MEMORY CELLS ARE INDIVIDUALLY ADDRESSABLE

FIELD OF THE INVENTION

The present invention relates to an organization of components on a digital recording medium, and more particularly to a unique semiconductor storage medium for addressable storage and retrieval of reproducible pre-recorded audio.

BACKGROUND OF THE INVENTION

A variety of recording media exist today for the storage of consumer directed pre-recorded music and other audio applications. These media include CD ROM (Compact Disc Read Only Memory), DAT (Digital Audio Tape) and traditional magnetic cassette audio tape, just to name a few. Of the above technologies, the compact disc format has steadily increased in popularity and gained consumer approval due to the high sound quality of the digitally stored audio, as well as ease of use.

Compact discs and other formats, however, have some significant disadvantages. For one, compact discs do not normally include the ability to register the content of the information stored on disc prior to selection at a player. In other words, in order to gain any information regarding the contents of a particular music selection, that selection will first have to be in some manner manually accessed at the player. In the alternative, some CD players may be manually programmed to play certain selections based upon user input. In either circumstance, however, there is no way to automatically search and play music by category, for example, by artist, music type, etc., unless a user has prior knowledge with regard to the selection.

In addition, compact discs, or optical digital discs, as they are sometimes referred, require mechanical drive systems of high accuracy and precise servo-controllers to be used in conjunction with solid state lasers for operation of a CD player. Thus, the fact that the disc must be rotated at a constant linear velocity during play requires a substantial number of precision-made movable mechanical pans which tend to fall out of design tolerance due to wear. This and other factors tend to limit the ruggedness and portability of present day CD systems. Moreover, because of the size of CDs and the need to protect their playing surfaces, the ability to conveniently transport more than a few compact discs at one time is also a limiting factor.

SUMMARY OF THE INVENTION

The present invention is directed to a memory device for digital storage of pre-recorded audio and other digitally stored data relating thereto. The memory device includes components for addressing, retrieving and automatically searching the stored data. In an illustrative embodiment, an array of memory cells for storage of the digitally recorded audio is contained within a modestly sized plastic package. In the preferred embodiment, the memory cells are comprised of Read Only Memory (ROM). Each of the memory cells is individually addressable over a parallel address bus and data is read and/or written over a parallel data bus. Data is transmitted to and from the device by means of a serial interface with a solid state audio player. Shift registers within the memory device are coupled to the serial interface for transmitting serial data to and receiving serial data from the audio player. Data buffers are interposed between the address bus, data bus and respective shift registers for storing data to be placed on the address bus and receiving data from the data bus. In accordance with one aspect of the invention, a series of capacitive plates is included to provide a contact-less interface between the memory device and the associated solid state audio player.

BRIEF DESCRIPTION OF THE FIGURES

For a better understanding of the present invention, reference may be had to the following description of exemplary embodiments thereof, considered in conjunction with the accompanying drawings, in which.

DETAILED DESCRIPTION OF THE DRAWINGS

Figure 1A:
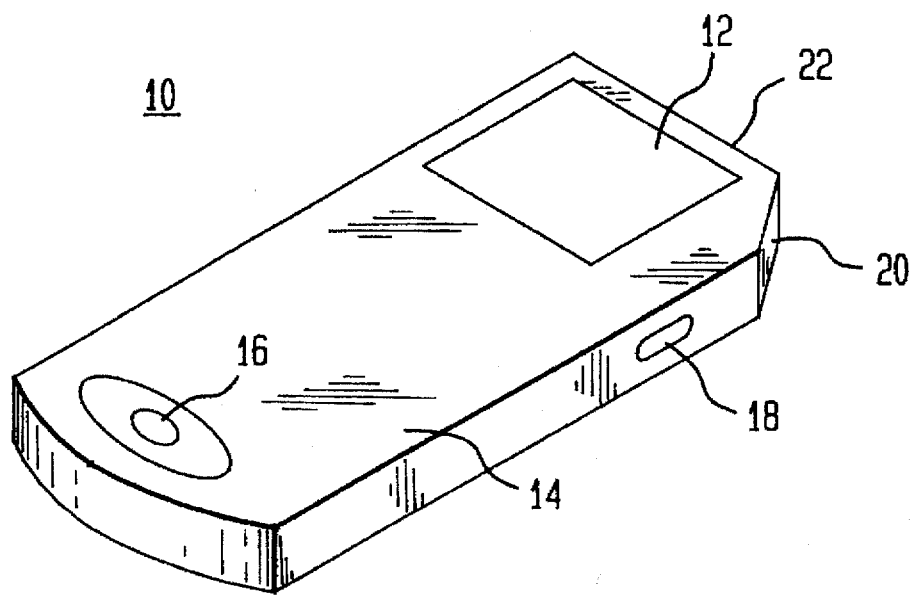
FIG. 1A shows a perspective view of one preferred embodiment for the packaging of the present invention memory chip.

Referring to FIG. 1A, there is shown one preferred embodiment of an integrated circuit package for the present invention memory chip, hereinafter referred to as a music chip 10. The music chip 10 is essentially a memory component which is adapted to be received into an accompanying solid state audio player for playing music contained in memory. The physical characteristics of the chip 10 are essentially that of a flat rectangular device having dimensions of approximately 2.5"×1.125"×0.25" and housed in a rugged ABS plastic (acrylic butyl styrene) or other like material. The relatively modest sized music chip device will have significant advantages over compact discs and other media with regard to transportability and storage. Memory and interface circuitry of the chip 10 are embedded within the package, as will be explained.

The music chip 10, as will be understood is intended for the storage of pre-recorded audio, namely, music. A graphics window 12 is included on a top surface 14 of the chip for display of artwork and other indicia associated with pre-recorded music sold in retail markets. Thus, the graphics window 12 will contain information similar in scope to that found on the front of a compact disc or cassette tape package. A front portion of the chip 10, at an opposite end from the graphics window 12 includes a cylindrical hollow 16 extending completely through the flat body portion of the chip. The hollow 16 presents a convenient manner for carrying one or more of the chips, in that the devices may be strung through the hollow and retained on a key chain or in another similar manner. On either side of the chip 10, proximate the graphics window 12, metal contacts 18, 19 are positioned for supplying power, ground and clock signals to the circuitry of the chip. A 45 degree notch 20 is located in the top fight hand corner of the chip 10 in order to conveniently designate the back end 22 of the chip as an area which should be first inserted into the audio player.

Figure 1B:
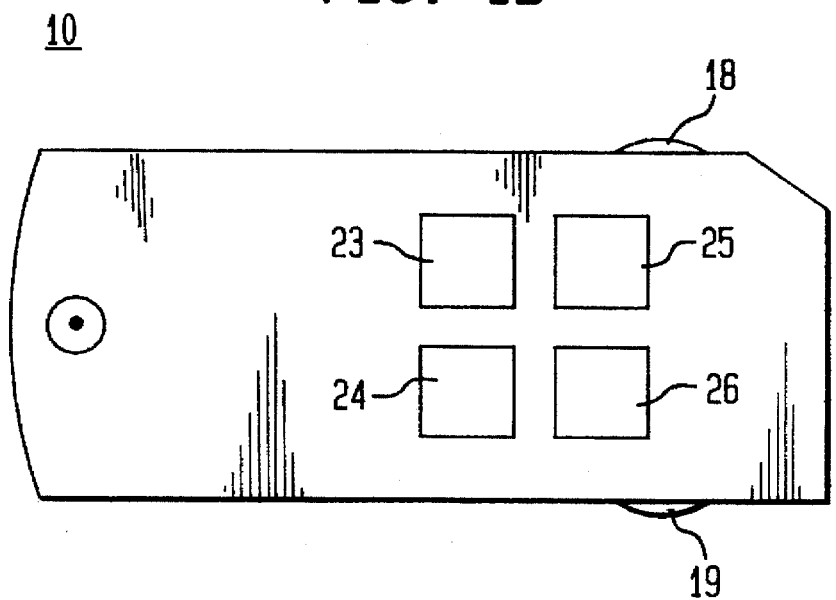
FIG. 1B shows a plan view for an underneath portion of the present invention memory chip.

Referring to FIG. 1B, an underside view of the chip 10 is depicted. A set of four capacitive plates 23–26 are embedded in the underside 28 of the chip for transfer of data between the chip and player. Utilizing the embedded capacitive plates 23-26 in conjunction with the rugged plastic housing material makes the device extremely tolerant to most any type of handling. In addition, because of the unique packaging and associated circuit design, many problems common to other types of integrated circuits, such as electro-static discharge (ESD), are greatly minimized.

The memory of the music chip 10, as has been explained, will contain prerecorded music or other like audio content, wherein the music is stored in a compressed digital format. Compression is performed according to an audio coding algorithm, a detailed discussion of which is not required for understanding of the present invention.

Figure 2:
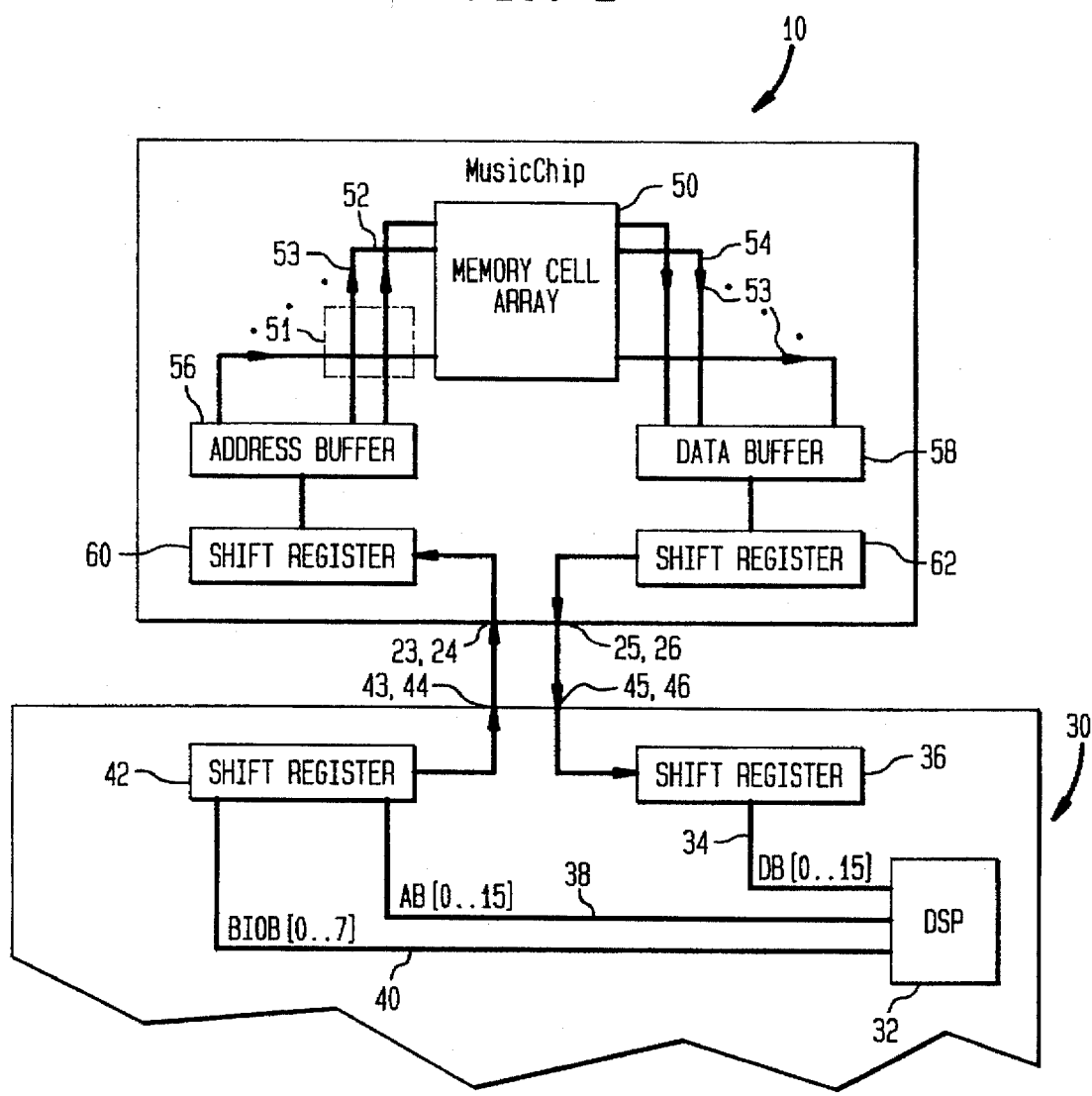
FIG. 2 shows one preferred embodiment of the internal circuitry for the present invention memory chip.

Referring to FIG. 2, there is shown one preferred representation for the internal circuit configuration of the present invention music chip 10. As has been mentioned, the music chip, 10 is adapted to be received into a solid state audio player. FIG. 2 depicts the music chip 10 as it is coupled to such an audio player 30. It will be understood that the audio player 30 will be any one of a number of devices, for example portable or stationary, which devices are adapted to access, receive and play digital audio stored in memory of a music chip 10 As shown, the audio player 30 includes a digital signal processor (DSP) 32 for decoding the digitally stored data in memory of the music chip. A data line 34 is coupled from the DSP 32 to a data shift register 36 on the player 30. An address line 38 and bit I/O line 40 are similarly coupled from the DSP to an address shift register 42. The address, bit I/O and data lines send and receive data to and from the shift registers 26, 42 which in turn send and receive data to and from the music chip 10. It will be understood that the address, bit I/O and data lines may be in bus format to accommodate parallel data transfer. In this case, the shift registers 36, 42 would necessarily be adapted to receive the parallel data and then output same in serial form, or in the alternative, receive serial data and be able to output the data in parallel. In either case, data is then transferred serially to and from the shift registers 36, 42 of the audio player 30 via matching capacitive plates 43–46 which correspond to the capacitive plates 23–46 of the music chip 10. The corresponding plates come into alignment when the music chip 10 is inserted within the audio player 30 creating a plurality of capacitors which form a capacitively coupled interface.

Referring again to FIG. 2, it can be seen that the structure of internal memory 50 the music chip 10 appears similar in nature to that, for example, of a flash EEPROM. An array of memory cells 50 is included therein, wherein each memory cell 50 is individually addressable via a parallel address bus 52. Each memory cell 50 is read from (or written to, if applicable) over a parallel data bus 54. The memory for the music chip will typically be Read Only Memory (ROM), wherein the pre-recorded digital audio will be represented in a mask which is copied at time of fabrication and which will exactly replicate the audio of a master recording from which it was reproduced.

As an alternative, the memory of the music chip can also be a type of programmable ROM (PROM), wherein each of the memory cells is written to a single time in order to store blocks of audio. As another alternative, the memory could also be a Random Access Memory (RAM) device, for example a nonvolatile RAM, wherein both read and write operations may be accomplished. In the case of pre-recorded audio, however, write operations to the music chip will never normally be necessary once the audio has been recorded, thus, the additional production costs associated with RAMs would not appear justified.

Within the shown embodiment of the music chip 10 in FIG. 2, a parallel address bus 52 and data bus 54 are coupled to each of the memory cells 50. It will be understood, of course, that the address bus may be coupled to the memory through decoder circuitry 51, which is known in the art. As shown, the address bus 52 and the data bus 54 are unidirectional buses with the designated arrows 53 being representative of the direction of data flow. That is, addresses from the audio player are accepted into the music chip to access specific memory locations, while data from the memory cells, after being accessed, is then output over the data bus 54. It will be understood, however, that the data bus, in particular, may be made to be bi-directional depending on the memory technology employed within the chip.

As can be seen in FIG. 2, the address bus 52 is coupled to an address buffer 56 and in a similar fashion the data bus 54 is coupled to a data buffer 58. The address buffer 56 and data buffer 58 are in turn coupled to an associated address shift register 60 and data shift register 62, respectively, in the music chip 10. The function of the address buffer 56 is to receive form the address shift register 60, wherein the address data can be accessed in parallel form, and output these addresses over the parallel address bus 52. In reverse fashion the data buffer 56 receives parallel data from the data bus 54 and temporarily buffers the data for parallel loading into the data shift register 62 Addresses and data are transferred serially to and from the shift registers 60, 62 of the music chip by means of the capacitive plates 23–26 which are aligned with the capacitive plates 43–46 of the audio player 30.

The transfer of addressing information and data to and from the chip 10 to the audio player 30 by means of capacitive plates 23–26 provides a significant advantage over other memory chip packages since the need for exposed electrical contacts is avoided. Conductive plates or electrodes having outer dielectric surfaces on both the chip 10 and the audio player 30 form an electrical interface when each plate in the chip is aligned in close proximity with a corresponding plate in the player. When the chip 10 is in place within the audio player, addressing information and data are then reliably transferred. This remains true even after some time of use, since as for the data transfer circuitry, there are no exposed metal surfaces to corrode or to which particles may collect. In addition, the potential of damage from electrostatic discharge to electronics within the chip is minimized since an insulator in the form of a dielectric is provided between the conductors of the chip and any sources from which the discharge might occur. It will be understood that other types of interfaces may also be utilized, for example metallic contacts, however, the capacitive interface is preferred for the reasons discussed.

Figure 3:
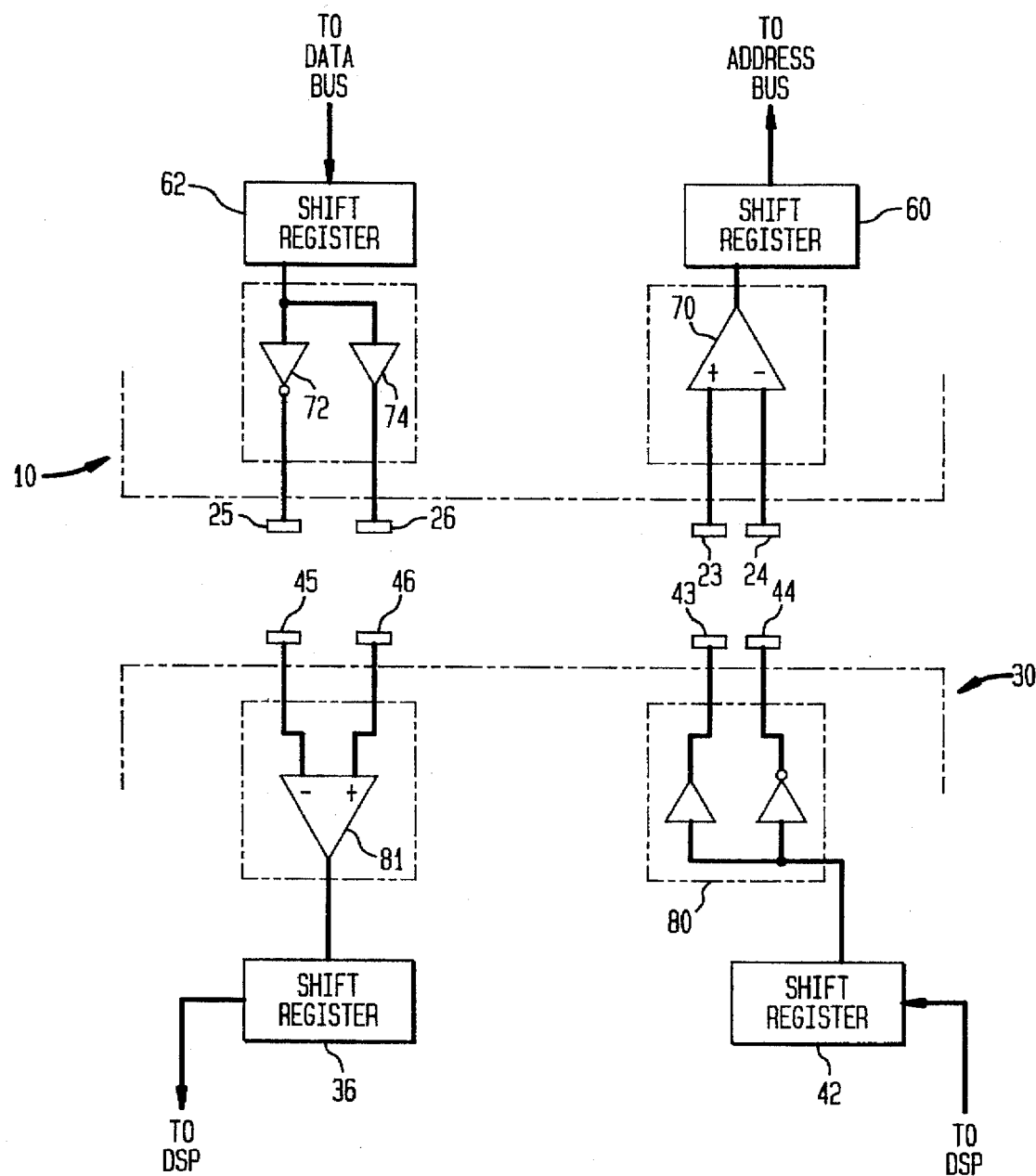
FIG. 3 shows one preferred embodiment for an interface used with the present invention memory.

Referring to FIG. 3, there is shown a more detailed illustration of the capacitive interface found within the music chip 10 and audio player 30. Capacitive plates 23, 24 are coupled to a data receive circuit comprised of a differential amplifier 70 adapted to receive data from corresponding capacitive plates 43, 44, the corresponding capacitive plates 43, 44 being coupled to differential drive circuits 80 on the player 30. The output of the differential amplifier 70 is coupled to the input of the shift register 60 which receives the serial addressing information as explained with reference to FIG. 2. A data output drive circuit, comprising driver amplifiers 72, 74, is coupled to the data shift register 62 and receives serial data therefrom to differentially drive the capacitive plates 25, 26. The capacitive plates 25, 26 coupled to the drive circuit are then capacitively coupled to corresponding plates 45, 46 in the player when the chip is inserted, wherein data is received at a differential amplifier 81 and received at shift register 36. The driver amplifiers 72, 74 convert serial data from the data shift register 62 of the music chip which is of one polarity, into a differential polarity such that for each transition of a signal from the chip, one of the drivers goes positive. Thus, two of the capacitive plates on the chip are utilized for data (or addressing) input, while two plates are used for data output. As can be seen, a mirror image of the same scheme is used for the player 30. The differential data transfer scheme ensures a more reliable transfer of information since two data terminals are active to indicate a transition from one state to another. Moreover, hysterisis is built into the data receive circuits to prevent false triggering from outside noise.

As has been explained, metallic contacts 18, 19, made for example, from nickel clad copper, are located on either side of the chip 10 to provide power, ground and clock signals to the internal circuitry thereof. Although metal contacts 18, 19 are provided on the chip, the contacts are mounted closely to the body of the chip so as not to protrude a great distance therefrom. This, in combination with surge protection coupled to the circuit lines running from the contacts will reduce the possibility of damage from ESD.

Figure 4:
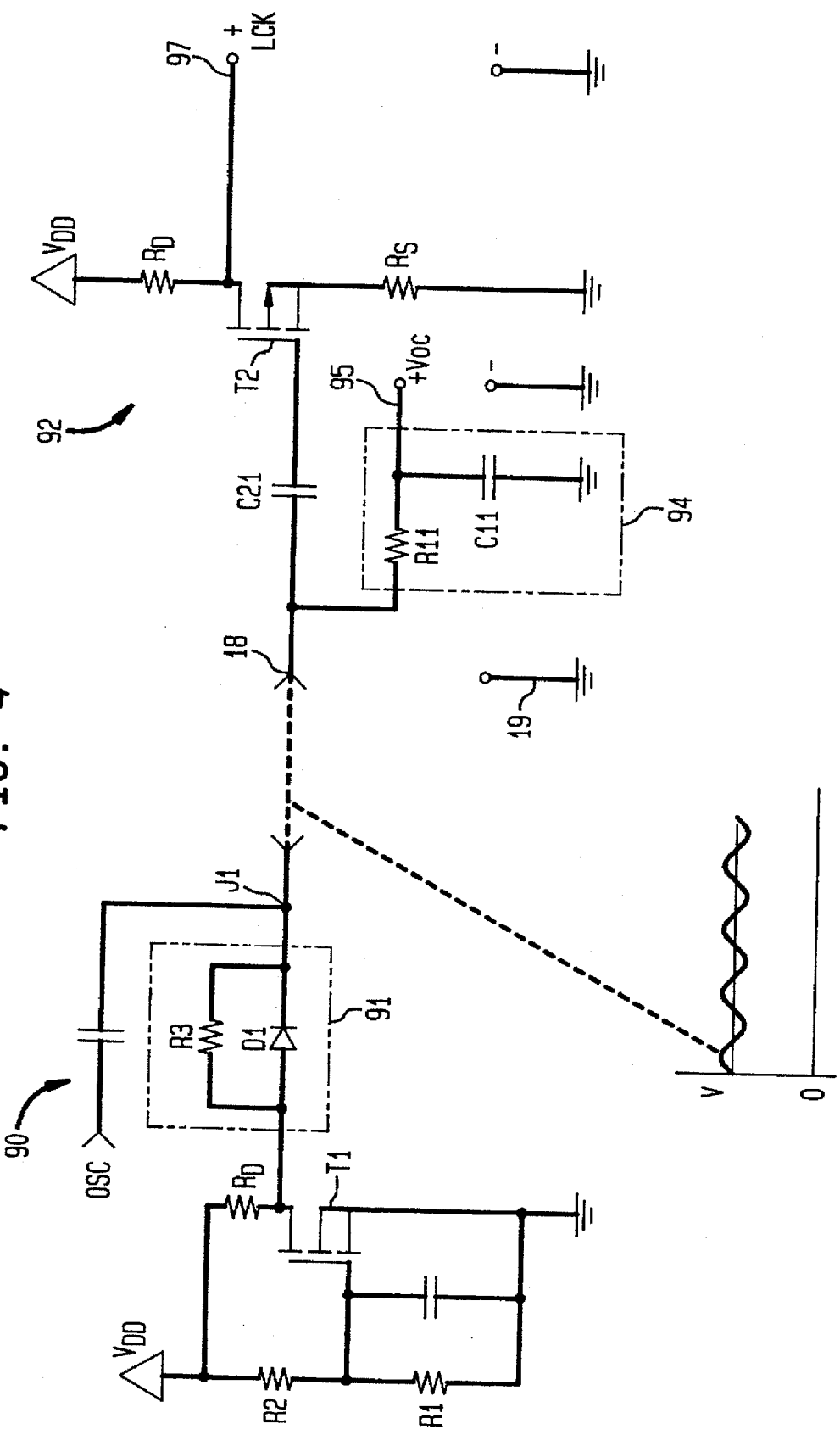
FIG. 4 shows one preferred embodiment of a dc offset circuit in the audio player used for mixing in the clock signal and a recovery circuit in the music chip used to recover each of the signals.

In a preferred embodiment of the invention, only two contacts are used to provide power (3.3 VDC), ground and clock signals, wherein the clock signal is transmitted in conjunction with one of the power connections. This is done to reduce susceptibility to ESD by minimizing the exposed contact area, as well as to minimize the effects of corrosion on exposed metal surfaces. Referring to FIG. 4, there are shown preferred embodiments of a dc offset circuit 90 and clock recovery circuit 92 used in the audio player 30 and music chip 10, respectively, to transmit the power and clock signals together from one contact. The dc offset circuit 90 includes transistor T1 (MOSFET) which is biased by means of resistive divider network comprised of resistors R1 and R2 and functions to provide a stable dc offset for the voltage output VDD of the audio player 30. The offset signal from the transistor T1 enters a diode-resistive network 91 which prevents bleed-back of the clock signal (OSC) into the power circuit. Diode D1 is forward biased to pass the offset signal. R3 is assigned a relatively large value, for example, one mega-ohm, so as to be able to pass only minimal feedback current. The clock signal (OSC) is added or mixed with the dc offset signal at junction J1 where the clock signal effectively rides on the dc carrier, as shown. Besides providing a stable offset value, the dc offset circuit of FIG. 4 also creates a buffer between the power circuitry and the exposed contact. The values of R1 and R2 are chosen according to the desired offset, wherein typically, R1 is selected to be much greater than R2.

The combination signal is transferred from the audio player 30 to the music chip through one of the metal contacts 18, 19, wherein the clock is extracted from the power signal by means of a clock/dc voltage (VDC) recovery circuit 92. The VDC recovery circuit is comprised of a low pass filter 94 including R11, C11. R11 and C11 integrate the input signal over time to produce a dc signal, wherein VDC appears at the output terminal 95 of the low pass filter 94. The clock recovery circuit 96 includes amplifying transistor T2 which is driven into enhancement or depletion mode by the ac clock signal. Capacitor C21 blocks the dc portion of the combination signal and the extracted clock signal appears at an output terminal 97 which is coupled to the drain of transistor T2. Depending on the clock frequency utilized, R11, C11 and RD, RS are chosen so that RD is much greater than RS. It will be understood that in the alternative, three contacts may be provided for the transfer of each of the signals individually. As is known in the art, data transfer is coordinated throughout the music chip 10 and audio player by means of the clock and other corresponding signals which are issued from the DSP.

In operation the present invention music chip 10 functions as follows. An address request is issued from the DSP 32 of the audio player 30 to read the contents of the data in a specific memory location of the music chip. Addressing information is transferred to the address shift register 42 of the audio player wherein it is transferred over the capacitive interface plates of the audio player and the chip, respectively. The address is received at the data receive circuit of the music chip 10 where it is converted to a standard serial data string and then stored in the address shift register 60. In accordance with the clock cycles and control signals of the DSP 32, the address information from the address shift register 60 is gated into the address buffer 56 where the information is placed on the parallel address bus 54 to access a specific memory location. Once the specific memory cell has been identified, data is read from the memory cell and placed on the parallel data bus 54. The data is transferred over the data bus 54 and received in parallel at the data buffer 58. Data from the data buffer 58 is then loaded into the data shift register 62 in parallel form. The data loaded in the data shift register 62 can then be serially output through the driver circuitry over the capacitive interface where it is received at the data shift register 36 of the audio player 30. The data is then ready to be processed by means of the DSP 32 In a preferred embodiment of the invention, data transfer to and from the memory will take place at a 150 Khz rate.

A unique architecture for digitally storing audio within a semiconductor chip has thus been presented. The chip allows for serial transfer of data to and from the chip by means of a capacitively coupled interface to the audio player. Serial data is then converted and transferred within the chip by means of parallel address and data buses. Data is then once again output in a serial fashion for decoding and processing by the audio player.

From the above, it should be understood that the embodiments described, in regard to the drawings, are merely exemplary and that a person skilled in the art may make variations and modifications to the shown embodiments without departing form the spirit and scope of the invention. All such variations and modifications are intended to be included within the scope of the invention as defined in the appended claims.

What is claimed is:

1. A memory chip for storage of digital data, said digital data corresponding to pre-record audio and said memory chip adapted for insertion into an associated audio player, said memory chip comprising;

a plurality of memory cells, each one of said memory cells being individually addressable for accessing of data therefrom;

first means coupled to said plurality of memory cells for receiving serial input data from said associated audio player;

second means coupled to said plurality of memory cells for outputting serial data from said memory chip;

said memory chip being adapted to receive a dc power, ground and clock signal from a dc offset circuit in said audio player, wherein said dc power signal and said clock signal are transferred in combination with one another over a single contact;

said dc offset circuit including a dc offset generator having a transistor biased by a resistive divider network of producing said dc power signal, a diode-resistive network for passing through said dc power signal and preventing bleed-back of said clock signal and a mixing means for mixing said clock signal with said dc power signal, wherein said dc offset circuit provides a buffer between said dc offset generator and an exposed contact; and said memory chip including a recovery circuit, said recovery circuit having a low pass filter for recovering said dc power signal, and a dc current blocking means coupled to a transistor amplifier for recovering said clock signal.

2. The memory chip of claim 1, wherein said first means is adapted to output said input data in parallel form and said second means is adapted to receive data in parallel form.

3. The memory chip of claim 2, wherein said memory chip includes a parallel address bus and parallel data bus, each said bus being coupled to said plurality of memory cells.

4. The memory chip of claim 3, further including:

address buffer means for interfacing with said address bus, said address buffer means adapted to temporarily store data which is output from said first means;

data buffer means for interfacing with said data bus, said data buffer means adapted to temporarily store data to be input to said second means.

5. The memory chip of claim 1, further including a plurality of capacitive plates for contactless input and output of data to and from said memory chip.

6. The memory chip of claim 5, further including an output drive circuit coupled to a shift register, said output drive circuit adapted to differentially output data.

7. The memory chip of claim 5, further including a data receive circuit adapted to receive differentially driven data.

8. The memory chip of claim 1, wherein said memory is included within a housing, said housing including a means for displaying indicia corresponding to said pre-recorded audio stored on said chip.

9. The memory chip of claim 8, wherein said housing includes an aperture extending completely through a portion of said chip, said aperture being adapted to facilitate transport of said memory chip.

10. The memory chip of claim 8, wherein said housing is comprised of acrylic butyl styrene.

11. The memory chip of claim 1, wherein said plurality of memory cells comprise Read Only Memory (ROM).

12. The memory chip of claim 1, wherein said plurality of memory cells comprise a type of programmable Read Only Memory.

13. The memory chip of claim 1, wherein said plurality of memory cells comprise a type of Random Access Memory (RAM).

14. The memory chip of claim 1, further including means for decoding said input data received from said audio player to thereby access specific ones of said memory cells.

15. A semiconductor chip memory apparatus for storage of pre-recorded audio, said memory apparatus adapted for use with a solid state audio player, said apparatus comprising:

a plurality of memory cells for storing digital data therein;

address shift register for receiving serial data corresponding to addresses of memory locations;

data shift register for outputting serial data read from selected memory locations;

said chip memory apparatus including a housing, said housing including a graphics display area for inclusion of indicia pertaining to said pre-recorded music; and said housing including a hole disposed at an end thereof, whereby said apparatus may be transported by means of a carrying device attached through said hole.

16. The apparatus of claim 15, further including a parallel address bus and parallel data bus, wherein said address shift register is adapted to output parallel address data on said address bus and said data shift register is adapted to receive parallel input data from said data bus.

17. The apparatus of claim 16, further including an address buffer and a data buffer, wherein said address buffer is operative to receive address information from said address shift register for placement on said address bus and said data buffer is operative to receive data from said data bus for input to said data shift register.

18. The apparatus of claim 15, wherein said address shift register and said data shift register couple to said audio player by means of capacitive plates.

19. The apparatus of claim 18, further including means for differentially transmitting data from and receiving data within said memory chip apparatus.

* * * * *